United States Patent
Gamble et al.

[11] Patent Number: 6,157,094
[45] Date of Patent: *Dec. 5, 2000

[54] SUPERCONDUCTING MAGNETS AND POWER SUPPLIES FOR SUPERCONDUCTING DEVICES

[75] Inventors: Bruce B. Gamble, Wellesley, Mass.; Calman Gold, Londonderry, N.H.; Gregory L. Snitchler, Shrewsbury, Mass.

[73] Assignee: American Superconductor Corporation, Westborough, Mass.

[*] Notice: This patent is subject to a terminal disclaimer.

[21] Appl. No.: 09/328,677

[22] Filed: Jun. 9, 1999

Related U.S. Application Data

[63] Continuation of application No. 08/674,448, Jul. 2, 1996, Pat. No. 5,965,959.

[51] Int. Cl.[7] .............................. H01H 47/00; H01F 1/00
[52] U.S. Cl. ........................ 307/113; 335/216; 505/150
[58] Field of Search ..................................... 307/112, 113, 307/116, 125, 139; 361/19; 335/216; 505/100, 150, 163

[56] References Cited

U.S. PATENT DOCUMENTS

| | | | |
|---|---|---|---|
| 3,568,002 | 3/1971 | Robins et al. | 361/141 |
| 4,688,132 | 8/1987 | Dustmann . | |
| 4,906,861 | 3/1990 | Roy et al. | 307/138 |
| 5,110,793 | 5/1992 | De | 505/869 |
| 5,181,170 | 1/1993 | Huang et al. | 363/21 |
| 5,225,956 | 7/1993 | Hara et al. | 327/366 |
| 5,347,168 | 9/1994 | Russo | 361/19 |
| 5,376,626 | 12/1994 | Drehman . | |
| 5,612,615 | 3/1997 | Gold et al. | 323/360 |
| 5,623,240 | 4/1997 | Sakuraba et al. | 335/216 |
| 5,680,085 | 10/1997 | Aihara et al. | 216/216 |

FOREIGN PATENT DOCUMENTS 56-134724  10/1981  Japan .
WO 96/24939  8/1996  WIPO .

OTHER PUBLICATIONS

R. C. Niemmann, Y.S. Cha, J. R. Hull, "Design of a High–Temperature Superconductor Current lead for Electric Utility SMES", The Babcock & Wilcox Company, Oct. 17, 1994.

American Superconductor Corporation, "American Superconductor Acheives World Record Performance In A High Temperature Superconducting Magnet System", (No month/yr available).

O. M. Nueller, K. G. Herd, "Ultra–High Efficiency Power Conversion Using Cryogenic MOSFETs and HT–Superconductors", General Electric Corporate Research and Development, 1993. (No month).

D. Aized, M. Manlief, C. H. Joshi, "Performance of High Temperature Superconducting Coils in High Background Fields at Different Temperatures", IEEE Trans. MAG30(4), 2010 (1994), and ASC projections (No month).

H. Beonig and D. Paice, "Fault Current Limiter Using a Superconducting Coil", IEEE Trans. MAG 19(3), (183), (No month).

(List continued on next page.)

*Primary Examiner*—Josie Ballato
*Assistant Examiner*—R. Rios Cuevas
*Attorney, Agent, or Firm*—Choate, Hall & Stewart

[57] ABSTRACT

The invention provides an apparatus for supplying power to superconducting loads includes a current source, a cryogenic region (e.g., a cryogenic chamber), a first switching device in series between the current source and a superconducting load, and a second switching device in parallel with the superconducting load. The switching devices are arranged so that, when the first is closed and the second is open, recharging current is supplied to the superconducting load. The second switching device serves as a shunt. When it is closed and the first is open, current recirculates through the persistent (or partially persistent) superconducting load. The invention also provides a superconducting magnet incorporating such a power supply.

41 Claims, 8 Drawing Sheets

OTHER PUBLICATIONS

Richard McFee, "Optimum Input Leads for Cryogenic Apparatus", *The Review of Scientific Instruents*, vol. 30, No. 2, Feb. 1959.

K. Efferson, "Helium Vapor Cooled Current Leads," *The Review of Scientific Instruments*, vol. 38, No. 12, Dec. 1967.

Twente University, H.J. TenKate, "Superconducting Rectifiers" (Thesis), Apr. 6, 1984.

Y. Iwasa, "Case Studies in Superconducting Magnets", Plenum, 1994, p. 372.

O.K. Mawardi, "Fast Superconducting Storgage Systems", IEEE Trans. MAG18(1), 151–156 (1982).

Kito, et al., "Development of a 6600 V/210 V 100 KVA Hybrid–Type superconducting Transformer", IEEE Trans. Power Del.6(2), 816–823 (1991), (no month available).

RAMPING MODE

PERSISTENCE MODE

SWITCHING CONTROL

CRYOGENIC GATE - DRIVE OUTPUT STAGE

SUPERCONDUCTING MAGNETS AND POWER SUPPLIES FOR SUPERCONDUCTING DEVICES

This application is a continuation of U.S. application Ser. No. 08/674,448, filed Jul. 2, 1996, now U.S. Pat. No. 5,965,959 which is incorporated by reference herein.

BACKGROUND OF THE INVENTION

The invention pertains to superconducting magnets and power supplies for superconducting devices such as superconducting magnets.

A superconducting device comprises a superconducting element (such as a superconducting ceramic coil) that is contained within a cryogenic chamber and that is driven by a power supply. The power supply is typically maintained at ambient temperature, e.g., 300° K., while the cryogenic chamber (and the superconducting devices therein) is maintained at the temperature of liquid nitrogen (77° K.) or below. Particularly, for ceramic superconducting elements, the chamber is maintained at so-called high temperature superconducting (HTS) ranges, to wit, 20°–110° K., while for metallic superconducting elements, the chamber is maintained at low temperature superconducting (LTS) temperature ranges, to wit, 4°–20° K.

Differences between the power supply temperature and cryogenic chamber temperature makes supplying power to the chamber difficult. Traditionally, power has been carried by conventional metallic wire leads (or joints) connecting the ambient temperature power supply to the cryogenic chamber. Use of such leads, however, makes it difficult (and expensive) to maintain a low temperature in the chamber. Particularly, if the leads have a thick cross section, they conduct a large amount of heat from the ambient environment into the chamber. If the cross section of the leads is reduced, the amount of heat transferred by conduction is lessened, although increased resistance in the metal results in heat input via resistive heating. One prior art solution for minimizing conductive and resistive heating is to cool the leads with cryogenic vapors, e.g., vapor from liquid helium; see Efferson, "Helium Vapor Cooled Current Leads," *The Review of Scientific Instruments*, Vol. 38, No. 12, December 1967.

The prior art suggests an additional approach for LTS applications. Rather than driving current through lossy conductive leads, it suggests using "flux pumps" to inductively pass power across the cryogenic barrier. In a nutshell, an AC-powered coil is placed on the outside of the chamber in order to induce alternating current flow in another coil on the inside of the chamber. A rectifier within the chamber converts the induced power to direct current (DC). See, TenKate, "Superconducting Rectifiers" (Thesis), Twente University, Apr. 6, 1984.

Thermally-activated superconductive switches are typically used to control the flow of current from the rectifier to the superconducting load. The switches typically constitute a material that is conductive at LTS temperatures, but nonconductive at higher temperatures. Those higher temperatures, which are only slightly above the LTS temperature, can be induced via small resistive elements disposed about the switches and activated via thin, low-current leads passing into the chamber. In LTS applications, e.g., superconducting magnets with metallic and intermetallic coils, these switches can be "thrown" with little heat input to the cryogenic chamber.

Flux pump technology has traditionally been thought to provide little value in HTS applications, e.g., superconducting magnets with ceramic coils. This is because thermally-activated superconductive switches operational in HTS temperature ranges are believed to require too much heat for transition between the open and closed states. Moreover, these switches, are not believed to change state rapidly enough to permit adequate control of superconducting ceramic coils and other HTS loads.

Where superconducting coils are employed as magnets, e.g., for medical magnetic resonance imaging, there is typically a need for constant magnetic field output. Metallic LTS superconducting coils are often used for these applications, since they are "persistent," i.e., they maintain constant current flows without additional applied power. Leads used to drive power into those coils can typically be disconnected to reduce heat loss, once coils have achieved the desired persistent states.

In contrast, magnets fashioned from superconducting ceramics or other HTS materials experience a phenomenon referred to as "flux creep." In these devices, a finite voltage drop across the device (e.g., NMR insert) necessitates permanent connection of the current leads and at least intermittent application of additional power.

In view of the foregoing, an object of this invention is to provide an improved power supply for superconducting devices, and, more particularly, a power supply that permits adequate powering and control of superconducting loads (such as coils) without adding excessive heat to the cryogenic chamber.

Another object to the invention is to provide a power supply for superconducting loads that can compensate for the "flux creep" traditionally experienced by ceramic superconducting loads and other HTS elements, without introducing a large amount of heat through permanently connected high current leads.

Still another object to the invention is to provide an improved power supply for metallic and intermetallic superconductors, or other LTS loads.

Yet further aspects of the invention are to provide improved superconducting magnets.

Still other objects of the invention are to provide such power supplies as can be readily constructed without great cost.

SUMMARY OF THE INVENTION

The aforementioned objects are attained by the invention which provides, in one aspect, apparatus for supplying power to superconducting loads. The apparatus includes a current source, a cryogenic region (e.g., a cryogenic chamber), a first switching device in series between the current source and a superconducting load, and a second switching device in parallel with the superconducting load. The switching devices are arranged so that, when the first is closed and the second is open, recharging current is supplied to the superconducting load. The second switching device serves as a shunt. When it is closed and the first is open, current recirculates through the persistent (or partially persistent) superconducting load.

In another aspect, the invention provides a power supply as described above in which the cryogenic region is maintained at temperatures suitable for inducing superconduction in the load. These can be temperatures in the high temperature superconducting (HTS) range, e.g., 20°–110° K., which are suitable for inducing superconduction in superconducting ceramics, oxides and other HTS elements.

In another aspect, the invention provides a power supply as described above in which the first switching device is a metal oxide semiconductor field effect transistor (MOSFET) device. The second switching element can also be a MOSFET device or, alternatively, a superconducting switch, e.g., a superconducting element through which current flow is controlled via small changes in temperature or an applied magnetic field.

Further aspects of the invention provide power supplies as described above in which the first and second switching elements are MOSFET devices maintained in a cryogenic region at HTS temperatures. Such a configuration is well suited, for example, for powering superconducting ceramic coils and other devices that lack full persistence. In applications for powering persistent loads, such as metallic and intermetallic coils, the second switching device can be a superconducting switch maintained at HTS temperatures, e.g., in the same cryogenic region as the first switching element, or at LTS temperatures (4°–20° K.), e.g., in a second cryogenic chamber.

Other aspects of the invention provide for use of a flux pump as a current source. According to these aspects, a power supply for a superconducting load includes a cryogenic region maintained at an HTS temperature, a current source, and a MOSFET switching device in series between the current source and superconducting load. The current source includes a first induction coil disposed outside the cryogenic region for generating magnetic flux in response to an implied alternating current. A second induction coil, disposed within the cryogenic region, generates alternating current in response to the flux generated by the first induction coil.

Although the alternating current generated by the second induction coil can be used to directly drive the superconducting load, a related aspect of the invention provides for a rectifier coupled to that coil for converting the current generated by it into direct current, i.e., for DC superconducting loads.

Still further aspects of the invention provide a superconducting magnet utilizing power supplies as described above for driving superconducting coils. That coil can be fabricated from a superconducting ceramic or other HTS superconducting material, as well as from a metallic, intermetallic superconducting coil, or other LTS superconducting material. Where superconducting ceramics or other HTS materials are used, the coil can be disposed in the same cryogenic region as the first switching element. Where metallic, intermetallic or other LTS superconducting materials are used, the coil can be disposed in a second cryogenic region. In the latter case, the second switching element can be a superconducting switch that is also disposed in that second region.

These and other aspects of the invention are evident in the drawings and in the description that follows.

BRIEF DESCRIPTION OF THE DRAWINGS

A further understanding of the invention may be attained by reference to the drawings in which.

DETAILED DESCRIPTION OF THE ILLUSTRATED EMBODIMENT

Figure 1:
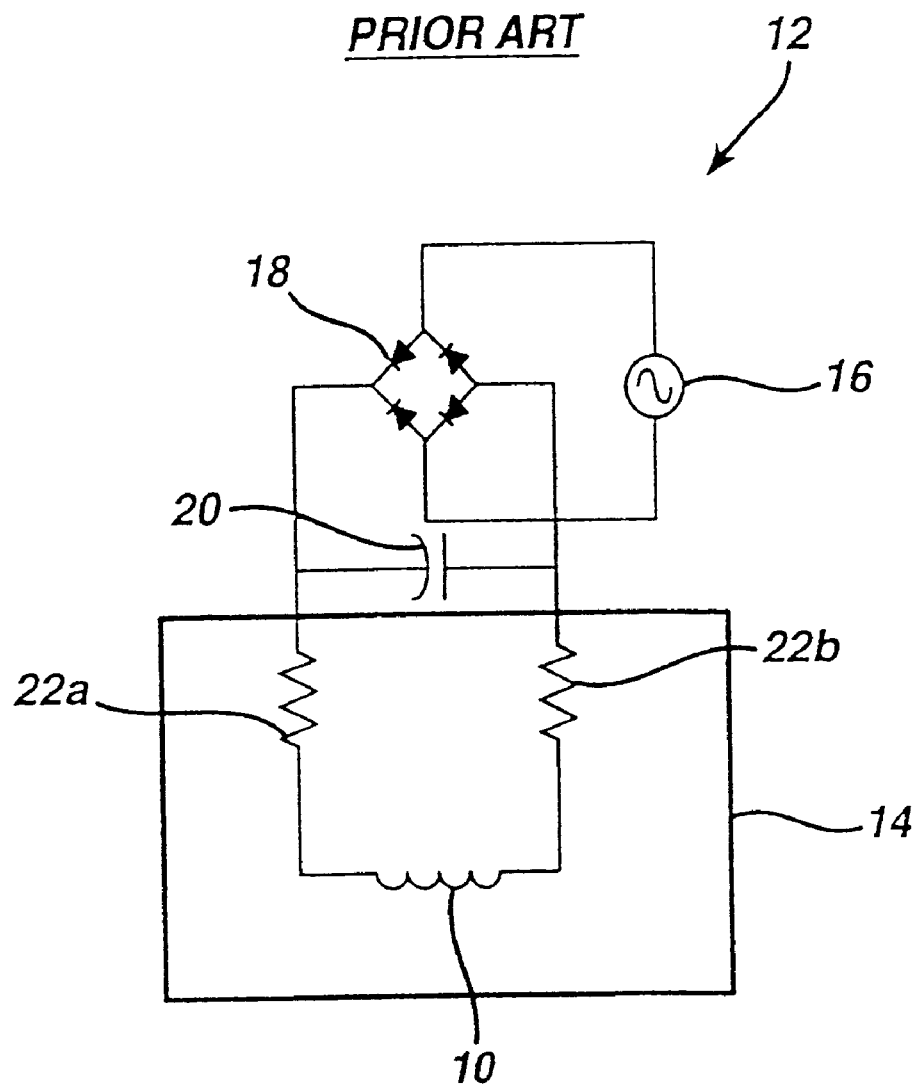
FIG. 1 depicts an HTS load driven by a prior art power supply.

FIG. 1 depicts a superconducting load 10 driven by a power supply 12 constructed and operated in accord with the prior art. The load 10 represents, for example, a superconducting ceramic or other HTS superconductor in cryogenic chamber 14, which maintains the load at HTS temperatures, i.e., 20°–110° K.

Prior art power supply 12 includes an alternating current (AC) source 16, the output of which is converted to direct current (DC) by rectifier 18. Current supplied by the rectifier charges capacitor 20 to complete the power supply circuit. Conductive leads 22A, 22B transfer current from the power supply 12 to the superconducting load 10.

As discussed above, a drawback of prior art power supply 12 is the heat it adds to the cryogenic chamber 14 through conductive leads (or joints) 22A, 22B. Those leads, which are typically fabricated from copper, can be of thin or thick cross-section. Thin leads transfer less heat into the cryogenic chamber 14 from the ambient temperature (300° K.) zone surrounding it. However, any sizable current flow through the leads will result in resistive losses, nonetheless injecting heat into the chamber 14. Although thick leads 22A, 22B are less subject to resistive heating, they conduct heat directly from the ambient zone into the chamber 14. As noted above, one prior art solution (not shown) is to cool conductive leads 22A, 22B with helium vapor. This solution is costly and has proven less than adequate.

Figure 2:
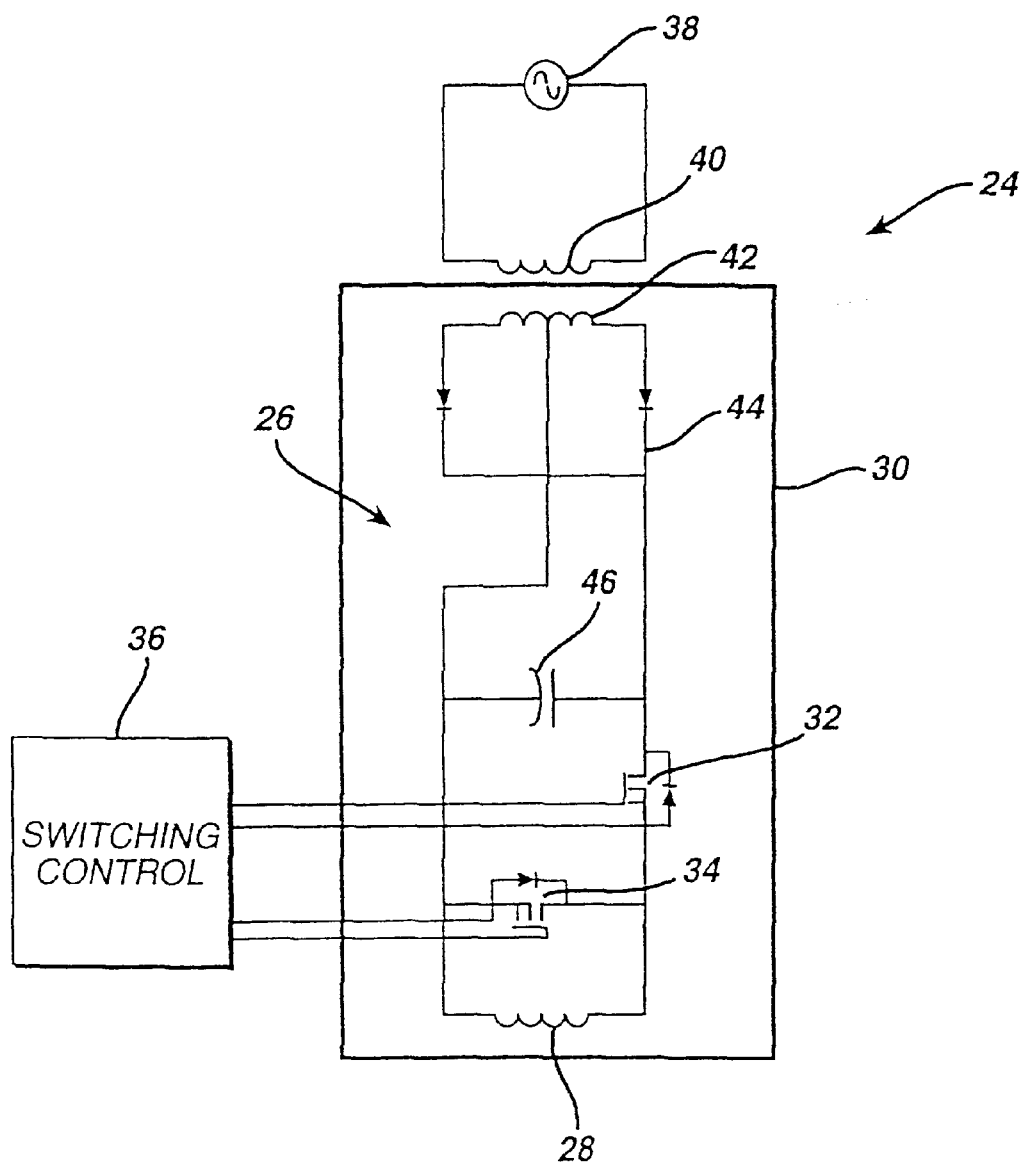
FIG. 2 depicts a power supply according to the invention for driving a superconducting ceramic or other HTS coil.

FIG. 2 depicts a superconducting magnet 24 according to the invention. The magnet 24 includes a power supply 26 according to the invention for driving a superconducting load 28 and, particularly, a superconducting ceramic or other HTS coil. Though the illustrated embodiment is an HTS superconducting magnet, those skilled in the art will appreciate that load 28 may constitute any superconducting element (or collection of elements) to which the power supply circuitry described herein is beneficially applied.

The superconducting load 28 is maintained at superconducting temperatures by cryogenic chamber 30. That chamber, which is constructed and operated in the conventional manner known in the art, maintains superconducting ceramic loads 28 at temperatures conducive to superconduction, e.g., 20°–110° K. Those skilled in the art will appreciate that specific operational temperatures for the chamber 30 will be selected in accord with the type of superconducting material (or materials) from which the load 28 is fabricated.

The illustrated power supply 26 comprises a current source, two switching elements 32, 34 and a switching control 36. The current source includes an AC power supply 38, first and second coils 40, 42 and rectifier 44, which includes capacitor 46. The AC power supply 38 supplies alternating current to coil 40 in the manner illustrated. This induces a changing magnetic field in the coil 40 which, in turn, induces alternating current flow in coil 42. As shown on the drawing, AC power source 38 and coil 40 are disposed outside the cryogenic chamber 30, e.g., in a zone of ambient temperature (e.g., 300° K.), whereas coil 42 is disposed within the chamber.

Those skilled in the art will recognize that power supply 38, external coil 40 and internal coil 42, together, comprise a "flux pump" that serves to transfer power across the cryogenic barrier in the absence of conductive leads or joints (cf. leads 22a, 22b of FIG. 1). Power supply 38 is constructed and operated in a manner conventional to the art. Coils 40 and 42 comprise conventional induction coils. They can be constructed from coils of metallic wire wound about a core of magnetic material (e.g., iron or ferrite) in a conventional manner. The coils can be fabricated, for example, by dividing in two a conventional transformer and placing each resulting coil (and its core) on opposing sides of a wall of chamber 30. The ratio of windings in external coil 40 to internal coil 42 can be 1:1, or any other ratio selected for the desired power configuration. More generally, the elements of the flux pump are chosen to supply power at a level appropriate to the superconducting load and the uses thereof. The selection and matching of power levels and loads is well known in the art.

Alternating current generated by the flux pump is converted to direct current by rectifier 44 disposed within the cryogenic chamber 30. The illustrated rectifier is a conventional full-wave center-tapped rectifier circuit and is operated in the conventional manner known in the art. Those skilled in the art will appreciate that other rectifier circuits can be substituted for the illustrated full-wave center-tapped rectifier 44. Such circuits include a full bridge rectifier, or in the case of a polyphase AC source, comparable implementations of polyphase rectifiers. Though the characteristics of the rectifier 44 are selected for accord with the output of coil 42 and demands of load 28, a preferred rectifier is selected to deliver direct current with a minimum of AC voltage ripple to the capacitor. In this respect, full wave rectifiers either single phase or polyphase are preferable to half-wave implementations.

Direct current supplied by the flux pump and rectifier 44 (including capacitor 46) is selectively transferred to the superconducting load 28 by switching elements 32, 34. As illustrated, first switching element 32 is disposed in series between the current source (i.e., flux pump and rectifier 44) and the superconducting load 28. As further shown in the illustration, the second switching element 34 is in parallel with the superconducting load 28 and interposed between it and the first switching element 32.

The first and second switching elements 32, 34 comprise metal oxide semiconductor field effect transistors (MOSFETs) that are arranged and controlled by switching control 36 to alternately (1) provide charging current to the superconducting load 28 ("ramping" mode), and (2) recirculating current in the load 28 ("persistence" mode). Preferred such MOSFET devices are N-channel enhancement mode devices exhibiting low on-resistance and supporting the maximum reverse voltage in the power supply without breakdown. In cryogenic operation of the MOSFET, the operating voltage rating of the MOSFET may be decreased by as much as 20% as compared with room temperature operating voltage rating. In instances where a single device does not exhibit low enough on-resistance, several MOSFETs may be connected in parallel to achieve the desired specification.

Figure 7:
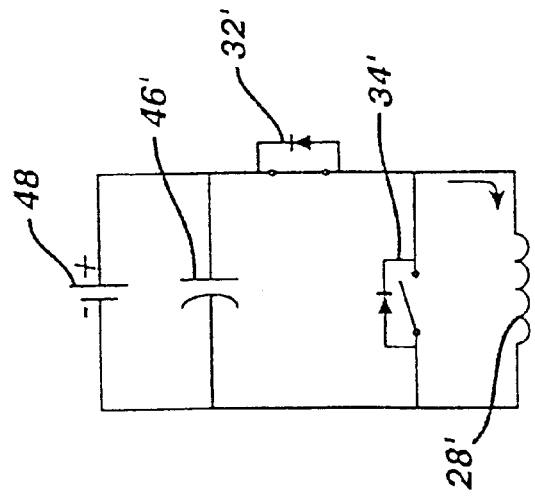
FIGS. 6–7 depict persistence and ramping modes of operation of a power source according to the invention.
Figure 6:
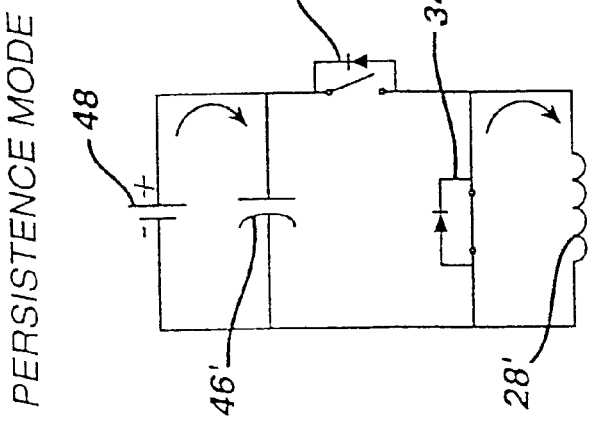

The ramping and persistence modes of operation are illustrated in greater detail in FIGS. 6 and 7. Referring to FIG. 6, rectifier 44 is represented by a DC power source 48. As in the rectifier 44, capacitor 46 is shown in parallel to the DC source 48. To avoid confusion, the capacitor is labeled 46' in the illustration. First and second switching elements 32, 34 are shown as switches 32', 34', along with their intrinsic diodes. Superconducting load 28 of FIG. 2 is represented by element 28' of FIG. 6.

As shown in FIG. 6, the power supply operates in persistence mode when switching element 32' is open and switching element 34' is closed. Particularly, in that configuration, current flowing through the superconducting load 28' is shunted by closed switch 34' for recirculation.

The switching element 34' is designed for minimum voltage drop, since it may carry current for the majority of time (presuming the load is reasonably persistent). For example, if the superconducting load 28' is designed with 1000 ampere leads and if switching element 34' has a resistance of 1 micro-ohm, the voltage drop will be 1 mvolt and the loss in the persistent mode will be 1 W. The resistance of the switching element 34' is, therefore, preferably of the order of 1 micro-ohm or lower for a 1000 ampere magnetic current.

Diode type voltage drops (e.g., IGBT's) are generally not acceptable for such an application. MOSFETs have a resistive drop, which can be reduced to an arbitrarily low number by paralleling a number of these devices in a conventional manner. As those skilled in the art will appreciate, the resistance can be dropped to an arbitrarily low value, limited only by packaging and cost considerations. It will also be appreciated that a synergistic effect is achieved when paralleling many such devices due to the reduction of the current carried per device, i.e., the lower dissipation per device reduces the self-heating and permits retention of a stable low on resistance. It will also be appreciated that a large reduction in the on-resistance of the MOSFET is achieved by operating the device in the cryogenic environment as opposed to room temperature.

Those skilled in the art will appreciate that superconducting loads and, particularly, superconducting coils lack resistance and, therefore, are capable of sustaining a persistence current. Because they are imperfect superconductors, superconducting ceramic coils (and other HTS coils) experience "flux creep" and, therefore, cannot sustain persistent currents for long periods.

Accordingly, the power supply can be configured as shown in FIG. 7 to supply a ramping current to the superconductor load 28'. In that drawing, first switching element 32' is closed, while second switching element 34' is open. As a result, current supplied by source 48 is applied to superconducting load 28', thereby ramping up the current flow. In ramping mode, as illustrated in FIG. 7, current from the source 48 (and capacitor 46') is driven into the superconducting load 28' until the desired current levels are achieved, at which time switches 32', 34' are thrown to place the system in persistence mode.

In order to better understand the operation of the invention, referring to FIG. 2, it will be appreciated that switching elements 32 and 34 are not active simultaneously. Simultaneous operation is prevented by the switching control 36 and, in accord with standard practice in such switching controllers, a small time interval or "dead time" is permitted to elapse between the activation of element 32 and the deactivation of element 34, and vice versa. It will furthermore be appreciated that because the operation of switching elements 32 and 34 are mutually exclusive, only one logic signal is required to operate the switching control. That is, the two control outputs of control 36 are essentially logically complementary signals.

The switching control 36 contains two gate driver circuits: the output of one controlling switching element 32, the output of the other controlling switching element 34. The gate drivers are responsive to one logical control signal, with logical inversion of one gate driver with respect to the other being performed in the gate driver circuit in accord with standard practice in the art. As is also standard practice in the art, a "charge pump" may be utilized to derive a floating potential bias for the gate driver circuit of element 32 from the DC potential on capacitor 46.

Figure 9:
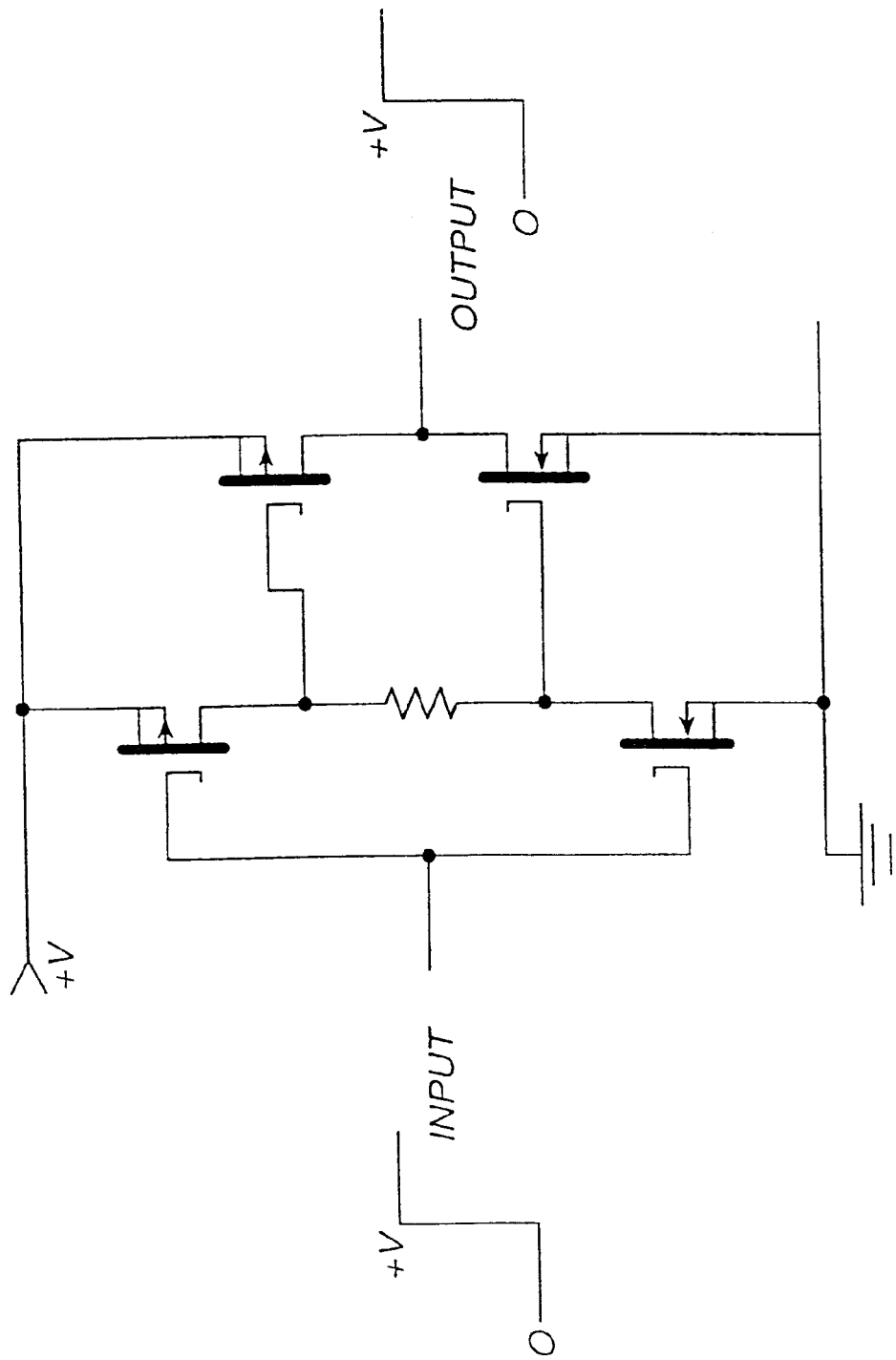

In a preferred embodiment, it is advantageous to operate the gate driver circuitry in the cryogenic environment. One advantage is the short electrical interconnection between the gate driver and its respective switching element. Another advantage is that cryogenically cooled gate drive circuits exhibit greater efficiency consistent with the overall goal of the invention to minimize dissipative losses in the cryostat. In a preferred embodiment, the gate driver circuit consists in a complementary MOSFET output stage as shown in FIG. 9. The circuitry shown functions as a current booster for the low power logical input signal thus permitting many paralleled MOSFETs to be driven simultaneously.

When the superconducting load is initially "ramped up" from zero current, the bridge portion of the circuit (rectifier 44) is operating essentially continuously. The losses during this mode of operation and made up of resistive drop, switching losses in the power electronic components and rectifier diode drops. If the load 28' is essentially a DC magnet, the ramping up period may be fairly infrequent. The load 28' "coasts" (i.e., is persistent) via action of switching element 34', as discussed above, and drifts down due to the voltage drop in the switching element 34' and the load 28'. As noted above, superconducting ceramic and other HTS loads are subject to flux creep. However, this can be expected in general to be low compared to the drop through the switching element 34'.

Referring back to FIG. 2, the switching control 36 alternately opens the first and second switching elements 32, 34 to effect persistence mode and ramping mode operation as described above.

In one embodiment of the invention, the switching control 36 alternates the switching configurations periodically. During the initial current ramp-up period, although the rectifier operates continuously, provision is made in the switching control 36 to inhibit the operation of switching element 32 periodically to permit rectifier 44 to restore the charge removed from capacitor 46 during the operation of switching element 32. This can be understood by observing that while switch 32 is conducting, the load current flows through capacitor 46 and discharges it by an amount $$dV=(I\times t)/C$$

where I is the load current, C is the capacitance of the capacitor 46, and t is the duration during which switching element 32 is conducting. It is via this discharge mechanism that energy is transferred from the capacitor 46 to the load 28. This places an upper limit on the permissible duration of operation of switch 32. Operating switch 32 for a longer period than given by the foregoing relation with a specified current, rectified voltage, and capacitance will result in a reverse polarization of capacitor 46 and will further result in an underdamped oscillation during which energy will be transferred from the load back to the capacitor and vice versa.

Figure 8:
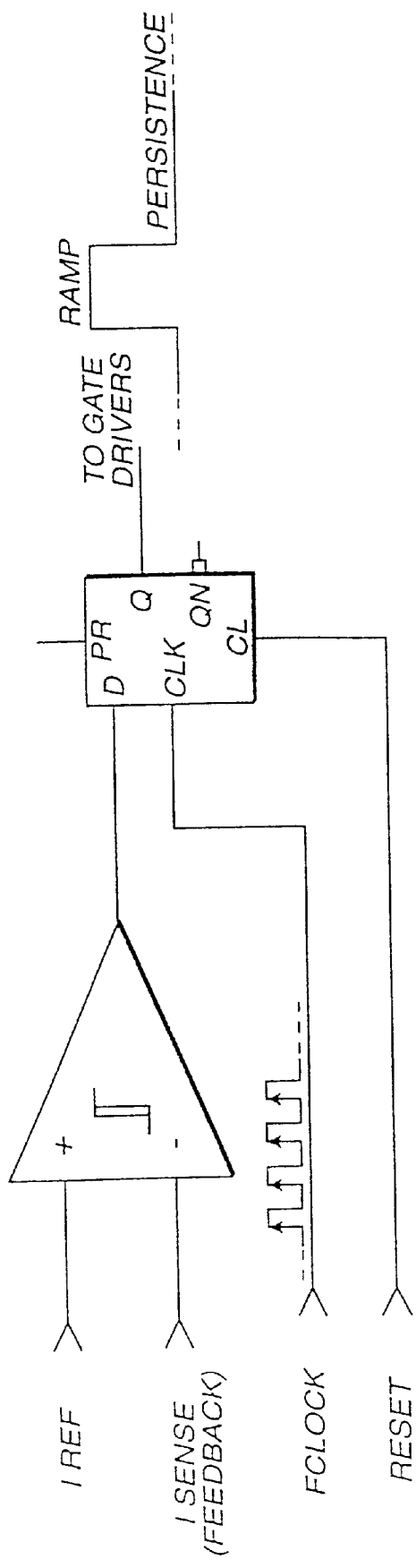
FIGS. 8–10 depict switching control circuitry utilized in a power supply according to the invention.

In preferred embodiment, a periodic pulsed logic signal is input to the switching control logic 36 both to limit the duration of conduction of switch 32 and to permit inhibiting the conduction of element 32 periodically during the initial ramp-up phase. The operation of this signal in conjunction with the switching control methodology is described in detail in the discussion of the switching control and with reference to FIG. 8. The period is selected in accord with the characteristics of the current source (i.e., flux pump and rectifier 44) and load 28.

In a preferred embodiment, switching control 36 configures switching elements 32, 34 to alternate between persistence and ramping mode by monitoring current flow through the load 28. Particularly, a current monitor (not shown) in series with the load 28 generates a current level signal proportional to the current flow through the load. That output is compared with a threshold current value to determine whether it falls below a desired level. If so, the switching control 36 configures the first and second switching elements 32, 34 to place the system in ramping mode. Otherwise, it configures the switching elements 32, 34 for persistence mode operation. A preferred circuit providing such switching control is shown on FIG. 8.

The switching control 36 consists in several elements which permit regulating the current in load 28. In a preferred embodiment, the regulation of load current is performed by a hysteretic comparator the output of which is the single logic signal necessary to appropriately configure the switching elements 32 and 34 via the gate driver circuitry. The inputs to the comparator are a reference potential which is proportional to the desired load current, and a feedback potential which is proportional to the actual measured current in the load. The comparator output is logically high if the load current is less than the desired reference, and low otherwise. If the comparator output is high, then switching element 32 is turned on and switching element 34 is turned off. This state corresponds to the ramp-up mode. If the comparator output is low, switch 32 is turned off and switch 34 is turned on. This state corresponds to the persistence mode.

To permit external inhibition of the regulation loop and to provide a means for limiting the maximum permissible duration of switch 32 conduction during the initial ramp-up phase, the output state of the comparator is strobed into an edge-triggered D-Flip-Flop by an external clock. This insures that state changes from ramp-up to persistence mode, and vice versa can only take place synchronously with the clock irrespective of the rate at which the comparator changes state. This furthermore guarantees that state changes at the D-Flip-Flop output are stable for at least one clock period. The "inhibit" function is provided by the direct overriding reset line of the D-Flip-Flop. When the reset is active, the output of the D-Flip-Flop is forced into the "persistence mode" logic low state. When the reset line is inactive, comparator state changes are synchronously transferred to the D-Flip-Flop output and to the gate driver circuitry thus regulating the load current automatically. During the initial ramp-up phase of operation of the flux pump, periodic activation of the reset line is effected for a duration sufficient to permit the recharge of capacitor 46.

In alternative embodiments, the inhibit duration during initial ramp up may be made to automatically increase as load current increases, this having the advantage of more rapid charging to a specified current. In yet another embodiment, the periodic inhibit logic signal may be derived directly from the D-Flip-Flop clock signal by a logical frequency divider or counter circuit.

As an alternative to periodic switching and switching based on current flow, switching control 36 can alternate between persistence and ramping modes based on a measured voltage drop across the load 28, or a measured magnetic field output by that element. Other such bases for feedback control will be apparent to those skilled in the art.

Those skilled in the art will appreciate that the signals for controlling switching elements 32, 34 can be inductively or optically coupled across the Dewar boundary of the chamber 30.

Figure 10:
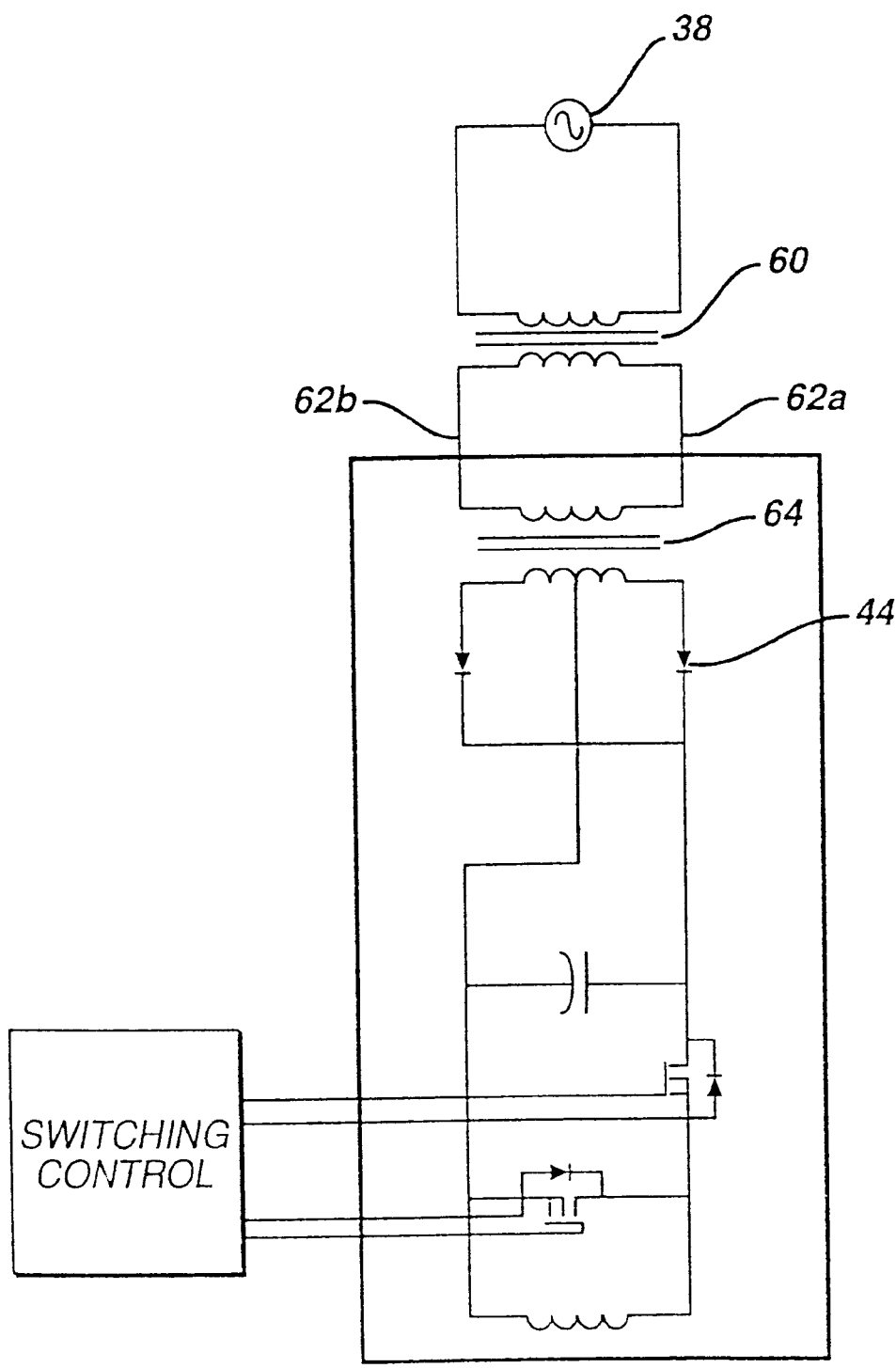

Described above and illustrated in FIG. 2 is a power supply according the invention for driving a superconducting load, particularly, a ceramic or other HTS coil. Those skilled in the art will appreciate that the power supply can be used in other configurations to drive such loads. For example, FIG. 10 depicts a superconducting magnet similar to that shown in FIG. 2 wherein low current, high voltage leads carry power across the Dewar boundary.

More particularly, power generated by supply 38 is stepped-up by transformer 60 residing outside the cryogenic chamber. That power is then passed across the Dewar boundary via low current-high voltage leads 62a, 62b, as shown. These leads, which can be fabricated from metal conductors and, preferably from copper or brass are optimized to minimize heat leak into the chamber while, at the same time, passing the currents required by the system. Power transferred into the chamber is stepped-down by transformer 64 for conversion to DC by rectifier 44. Transformers 60 and 64 are constructed and operated in the conventional manner known in the art. Step-up transformer 60 can, for example, be a conventional transformer for boosting voltage by a factor of 10, while decreasing current by a factor of 10. Step-down transformer 64 reverses that transformation. As shown in the illustration, that transformer can share a coil in common with the rectifier circuit 44.

Power supplies according to the invention may also be used to drive still further superconducting magnets and loads. For example, referring to FIGS. 3–5 there are shown superconducting magnets utilizing power supplies according to the invention for driving metallic, intermetallic or other LTS coils maintained at temperatures conducive to superconduction therein, (e.g., 4°–20° K.).

Figure 3:
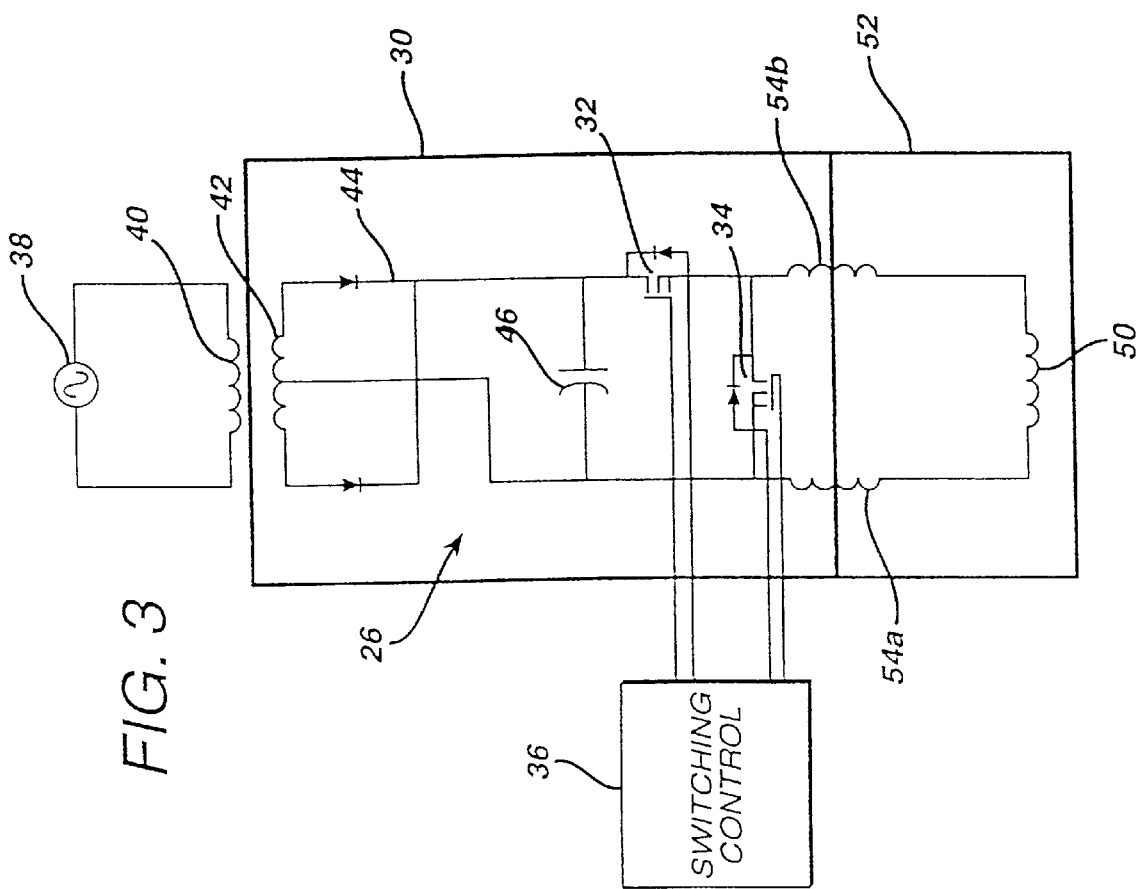

Referring to FIG. 3, there is shown a power supply constructed and operated similarly to that shown in FIG. 2 and described above. In lieu of the ceramic coil or other superconducting load 28 shown in FIG. 2, the power supply of FIG. 3 drives a superconducting load 50 contained in a second cryogenic chamber 52. The illustrated load 50 comprises a metallic or intermetallic coil, or other LTS superconducting load, of the type known in the art. The load 50 is maintained at temperatures conducive to superconduction (e.g., 4°–20° K.) by chamber 52, which is constructed and operated in the conventional manner.

Direct current generated by rectifier 44 (and a capacitor 46) is supplied to superconducting load 50 via superconducting leads 54a, 54b. Those leads are connected across second switching element 34 in the manner illustrated. Likewise, superconducting lead 54b is connected in series with first switching element 32 as illustrated. Superconducting leads 54a, 54b comprise ceramic, metallic and/or intermetallic materials fabricated in the conventional manner to deliver current from the first cryogenic chamber (which is maintained at 20°–110° K.) and the second cryogenic chamber (which is maintained at 4°–20° K.).

Switching control 36 is coupled to first and second switching elements 34 in the manner described above to configure the system in ramping and persistence modes. As above, in persistence mode, first switching element 32 is open, while second switching element 34 is closed, thereby permitting recirculation of current in the superconducting load 50. In ramping mode, first switching element 32 is closed, while second switching element 34 is open, thereby supplying ramping current to the superconducting load 50.

Switching control 36 alternates the switch configuration between ramping and persistence modes in a manner similar to that described above, e.g., on a periodic basis or as a function of current flow through the superconducting load 50. Those skilled in the art will appreciate that the enhanced persistence of metallic and intermetallic superconducting materials permits the illustrated system to remain in persistence mode for longer periods and, thereby, necessitates less frequent switching between the modes.

Figure 4:
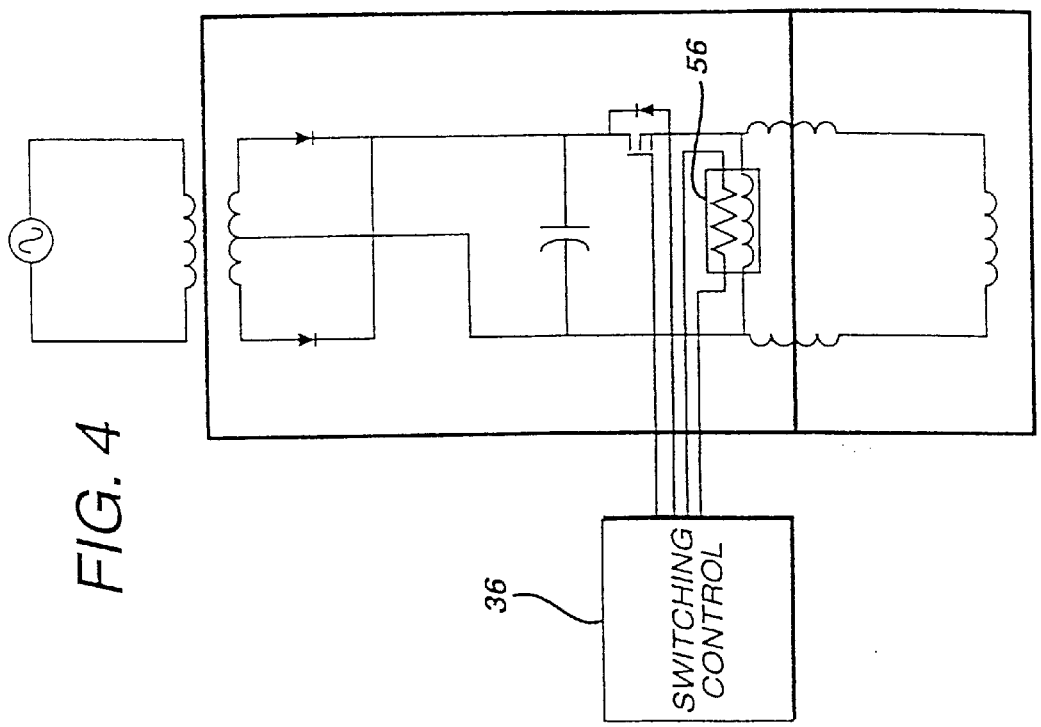
FIGS. 3–5 depict a power supply according to the invention for driving a metallic, intermetallic or other LTS coil maintained in a second cryogenic chamber.
Figure 5:
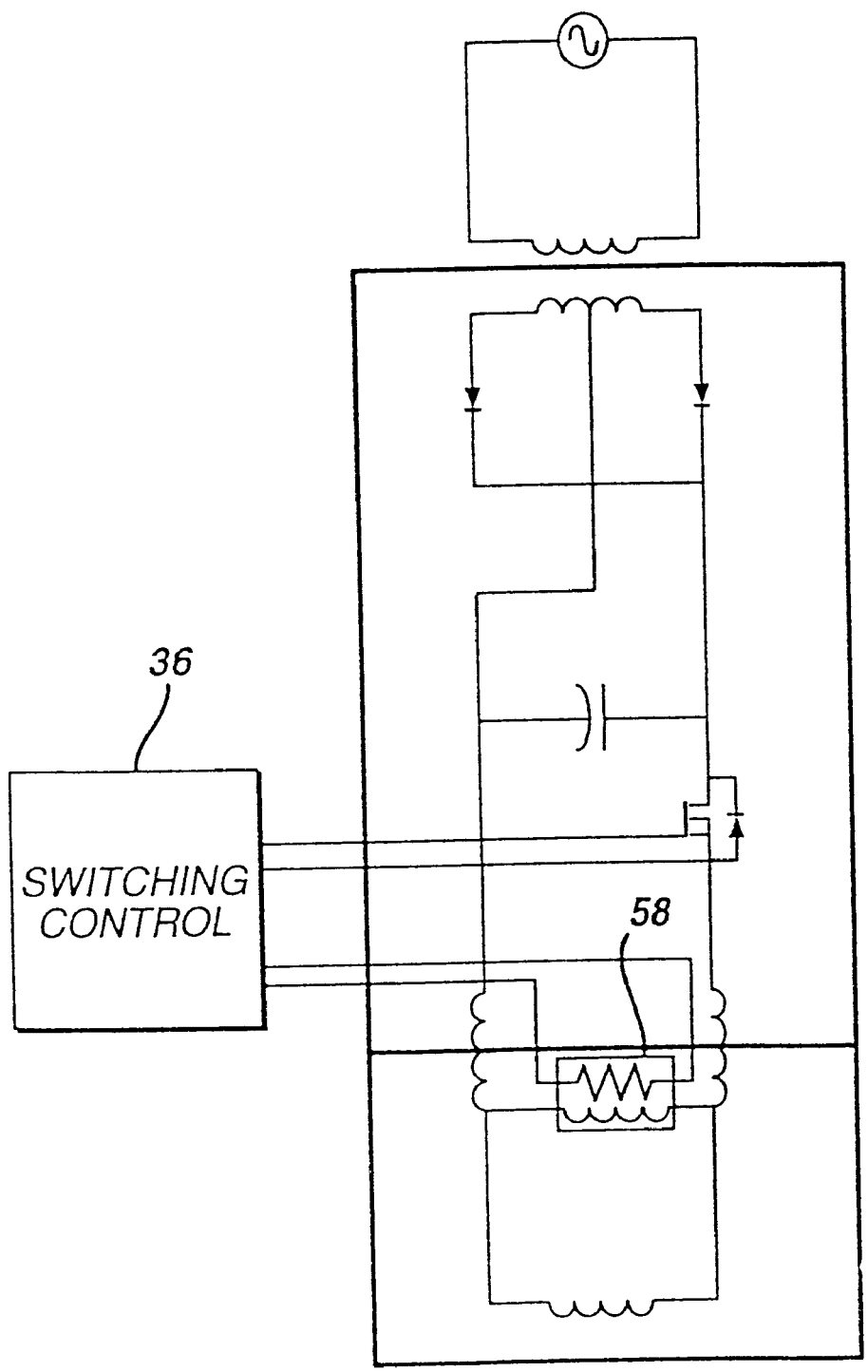

Superconducting magnets capitalizing on this are shown in FIGS. 4 and 5. Those magnets which are constructed nearly identically to that shown in FIG. 3 utilize superconducting switches in place of the second switching element 34. Particularly, the embodiment shown in FIG. 4 utilizes a superconducting switch 56 disposed within the first cryogenic chamber, i.e., that maintained at 20°–110° K. The embodiment shown in FIG. 5, on the other hand, employs superconducting switch 58 in lieu of the second switching element 34. As evident in the illustration, switch 58 resides within the second cryogenic chamber and is maintained at temperatures between 4° and 20° K.

The superconducting switches 56, 58 are fabricated in the conventional manner. The switches can comprise, for example, a noninductive coil or lead of superconducting ceramics, oxides or other HTS elements (56 in FIG. 4) adjacent a resistor that heats the lead and takes it into and out of the superconducting state or, alternatively, surrounded by a coil that generates an external magnetic field for this same purpose. Still further, they can comprise NbTi filaments in a CuNi matrix (58 in FIG. 5).

It will be appreciated that superconducting ceramics, oxides and other HTS materials are not truly persistent. In a practical sense, they can have a low electric field state that is practically persistent, i.e., they suffer a dissaptive electric field below $10^{-11}$ v/cm (and the corresponding losses).

A superconducting switch 56, 58 may not react sufficiently rapidly in some applications to permit it to substitute for the MOSFET switch 34 of FIG. 3. In these applications, the switch 56, 58 is arranged in parallel with the MOSFET switch 34, in either the first or second cryogenic chambers. In ramping mode, the MOSFET switch 34 is closed in order to provide charging current to the superconducting load, while the switch 56, 58 is open. When the desired current level in the load is achieved, the switch 56, 58 is closed. This permits the current to recirculate through the load and the switch 56, 58. This can be advantageous insofar as recirculation through the superconducting switch results in lower power dissipation then recirculation through the MOSFET switch 34.

Those switches 56, 58 are controlled by switching control 36 in a manner similar to that described above. Particularly, the switches are opened via current flow through their control leads, and closed via removal of that current.

Described above are power supplies for superconducting devices and superconducting magnets meeting the object set forth herein. Those skilled in the art will appreciate that the embodiments shown in the drawings and described above are merely examples of the invention and that further embodiments, employing additions and modifications thereto, fall within the scope of the invention. For example, it will be appreciated that switching control 36 can open and control the first and second switching elements as a function of voltage drop across the respective superconducting loads or as a function of the magnetic field output by those loads (in the case of superconducting coils), as well as in the manner described above. These and other modifications within the reach of those skill in the art are contemplated by the invention as well, of which

We claim:

1. An apparatus for supplying power to a superconducting load, the apparatus comprising:
   a current source;
   a first cryogenic region at a high temperature superconducting (HTS) temperature;

a first switching device in series between the current source and the superconducting load for selectively transferring current from the current source to the superconducting load, the first switching device comprising a metal oxide semiconductor field effect transistor (MOSFET) device disposed in the first cryogenic region; and a circuit path which recirculates current through the superconducting load when the first switching device is off, wherein the apparatus maintains the current through the superconducting load within a predetermined range.

2. An apparatus according to claim 1, wherein the circuit path comprises:

a second switching device in parallel with the superconducting load and interposed between the first switching device and the superconducting load, wherein the first switching device, when closed while the second switching device is open, provides recharging current to the superconducting load, and the second switching device, when closed while the first switching device is open, shunts current for recirculation through the superconducting load.

3. An apparatus according to claim 2, wherein the second switching device is a MOSFET device disposed in the first cryogenic region.

4. An apparatus according to claim 2, wherein the second switching device is ceramic superconducting switch disposed in the first cryogenic region.

5. An apparatus according to claim 2, wherein the superconducting load and the second switching device are disposed in a second cryogenic region.

6. An apparatus according to claim 5, wherein the second cryogenic region is at a low temperature superconducting (LTS) temperature.

7. An apparatus according to claim 6, wherein the second switching device is any of a metallic and intermetallic superconductor.

8. The apparatus according to claim 5 wherein the first and second cryogenic regions are connected by high temperature superconducting (HTS) leads.

9. An apparatus according to claim 1, wherein the current source comprises a first induction coil disposed outside the cryogenic region for generating magnetic flux in response to an applied alternating current, and a second induction coil disposed within the cryogenic region for generating alternating current in response to magnetic flux generated by the first induction coil.

10. An apparatus for supplying power to a superconducting load, the apparatus comprising:

a first cryogenic region at a high temperature superconducting (HTS) temperature;

a current source including:

a first induction coil disposed outside the cryogenic region for generating magnetic flux in response to an applied alternating current; and a second induction coil disposed within the cryogenic region for generating alternating current in response to magnetic flux generated by the first induction coil, and a first switching device in series between the current source and the superconducting load for selectively transferring current from the current source to the superconducting load, the first switching device comprising a metal oxide semiconductor field effect transistor (MOSFET) device disposed in the first cryogenic region; and a circuit path which recirculates current through the superconducting load when the first switching device is off, wherein the apparatus maintains the current through the superconducting load within a predetermined range.

11. An apparatus according to claim 10, wherein the current source comprises a rectifier coupled to the second induction coil for converting the alternating current generated thereby into direct current.

12. An apparatus according to claim 10, wherein the circuit path comprises:

a second switching device in parallel with the superconducting load and interposed between the first switching device and the superconducting load, wherein the first switching device, when closed while the second switching device is open, provides recharging current to the superconducting load, and the second switching device, when closed while the first switching device is open, shunts current for recirculation through the superconducting load.

13. An apparatus according to claim 12, wherein the second switching device is a MOSFET device disposed in the first cryogenic region.

14. An apparatus according to claim 12, wherein the second switching device is ceramic superconducting switch disposed in the first cryogenic region.

15. An apparatus according to claim 12, wherein the superconducting load and the second switching device are disposed in a second cryogenic region.

16. An apparatus according to claim 15, wherein the second cryogenic region is at a low temperature superconducting (LTS) temperature.

17. The apparatus according to claim 16, wherein the first and second cryogenic regions are connected by high temperature superconducting (HTS) leads.

18. An apparatus according to claim 16, wherein the second switching device is any of a metallic and intermetallic superconductor.

19. A superconducting magnet comprising:

a current source;

a superconducting coil;

a first cryogenic region at a high temperature superconducting (HTS) temperature, a first switching device in series between the current source and the superconducting coil for selectively transferring current from the current source to the superconducting coil, the first switching device comprising a metal oxide semiconductor field effect transistor (MOSFET) device disposed in the first cryogenic region; and a circuit path which recirculates current through the superconducting load when the first switching device is off, wherein the superconducting magnet maintains the current through the superconducting coil within a predetermined range.

20. A superconducting magnet according to claim 19, wherein the circuit path comprises:

a second switching device in parallel with the superconducting coil and interposed between the first switching device and the superconducting coil, wherein the first switching device, when closed while the second switching device is open, provides recharging current to the superconducting coil, and the second switching device, when closed while the first switching device is open, shunts current for recirculation through the superconducting coil.

21. A superconducting magnet according to claim 20, wherein the second switching device is a MOSFET device disposed in the first cryogenic region.

22. A superconducting magnet according to claim 20, wherein the second switching device is ceramic superconducting switch disposed in the first cryogenic region.

23. A superconducting magnet according to claim 20, wherein the superconducting coil and the second switching device are disposed in a second cryogenic region.

24. A superconducting magnet according to claim 23, wherein the second cryogenic region is at a low temperature superconducting (LTS) temperature.

25. A superconducting magnet according to claim 24, wherein the first and second cryogenic regions are connected by high temperature superconducting (HTS) leads.

26. A superconducting magnet according to claim 24, wherein the second switching device is any of a metallic and intermetallic superconductor.

27. A superconducting magnet according to claim 19, wherein the current source comprises
a first induction coil disposed outside the cryogenic region for generating magnetic flux in response to an applied alternating current, and
a second induction coil disposed within the cryogenic region for generating alternating current in response to magnetic flux generated by the first induction coil.

28. A superconducting magnet for supplying power to a superconducting coil, the superconducting magnet comprising:
a first cryogenic region at a high temperature superconducting (HTS) temperature;
a current source including:
a first induction coil disposed outside the cryogenic region for generating magnetic flux in response to an applied alternating current; and
a second induction coil disposed within the cryogenic region for generating alternating current in response to magnetic flux generated by the first induction coil;
a superconducting coil;
a first switching device in series between the current source and the superconducting coil for selectively transferring current from the current source to the superconducting coil, the first switching device comprising a metal oxide semiconductor field effect transistor (MOSFET) device disposed in the first cryogenic region; and
a circuit path which recirculates current through the superconducting load when the first switching device is off,
wherein the superconducting magnet maintains the current through the superconducting coil within a predetermined range.

29. A superconducting magnet according to claim 28, wherein the current source comprises a rectifier coupled to the second induction coil for converting the alternating current generated thereby into direct current.

30. An superconducting magnet according to claim 28, wherein the circuit path comprises:
a second switching device in parallel with the superconducting coil and interposed between the first switching device and the superconducting coil, wherein
the first switching device, when closed while the second switching device is open, provides recharging current to the superconducting coil, and the second switching device, when closed while the first switching device is open, shunts current for recirculation through the superconducting coil.

31. A superconducting magnet according to claim 30, wherein the second switching device is a MOSFET device disposed in the first cryogenic region.

32. A superconducting magnet according to claim 30, wherein the second switching device is ceramic superconducting switch disposed in the first cryogenic region.

33. A superconducting magnet according to claim 30, wherein the superconducting coil and the second switching device are disposed in a second cryogenic region.

34. A superconducting magnet according to claim 33, wherein the second cryogenic region is at a low temperature superconducting (LTS) temperature.

35. A superconducting magnet according to claim 34 wherein the leads connecting the cryogenic regions are high temperature superconducting (HTS) leads.

36. A superconducting magnet according to claim 34, wherein the second switching device is any of a metallic and intermetallic superconductor.

37. In an apparatus operational at an high temperature superconducting (HTS) temperature, the apparatus being of the type having a cryogenic region at an HTS temperature and having a load, the improvement comprising one or more MOSFET devices disposed in the cryogenic region and connected to the load for alternately (i) shunting current for recirculation through the load, and (ii) providing recharging current to the load, wherein the apparatus maintains the current through the superconducting load within a predetermined range.

38. In an apparatus according to claim 37, the further improvement comprising switch control circuitry coupled to the one or more MOSFET devices for causing them to alternate between shunting current and providing recharging current based on a selected operational condition of the load.

39. In an apparatus according to claim 38, the further improvement wherein the switch control circuitry causes the one or more MOSFET devices to alternate between shunting current and providing recharging current based on a level of at least one of a current flow in, a voltage drop across, or magnetic field created by load.

40. In an apparatus according to claim 38, the further improvement wherein the switch control circuitry causes the one or more MOSFET devices to periodically alternate between shunting current and providing recharging current to the load.

41. In an apparatus according to claim 37, the further improvement wherein the one or more MOSFET devices comprise:
a first MOSFET switch in series with the current source and interposed between the current source and the load;
a second MOSFET switch in parallel with the HTS devices and interposed between the first MOSFET switch and the load;
the first MOSFET switch, when closed while the second MOSFET switch is open, providing recharging current to the load; and
the second MOSFET switch, when closed while the first MOSFET switch is open, shunting current for recirculation through the load.

* * * * *